United States Patent [19]

Kahn et al.

[11] Patent Number: 4,606,846

[45] Date of Patent: Aug. 19, 1986

[54] MIXED RARE EARTH METAL, DIVALENT TRANSITION METAL, ALUMINUM OXIDE

[75] Inventors: Andrée Kahn, Paris; Anne-Marie Lejus, Montrouge; Jeanine Thery, Paris; Daniel Vivien, Garches, all of France

[73] Assignee: Centre National de la Rechereche Scientifique, Paris, France

[21] Appl. No.: 491,410

[22] Filed: May 4, 1983

Related U.S. Application Data

[63] Continuation of Ser. No. 281,396, Jul. 8, 1981, abandoned.

[30] Foreign Application Priority Data

Jul. 8, 1980 [FR] France .................. 80 15171

[51] Int. Cl.$^4$ .................................... C09K 11/08
[52] U.S. Cl. ..................... 252/301.4 R; 156/DIG. 63
[58] Field of Search .................... 252/301.4 R, 62.57; 156/DIG. 63, 615, 624

[56] References Cited

U.S. PATENT DOCUMENTS

| | | | |
|---|---|---|---|
| 3,252,103 | 5/1966 | Geusie et al. | 330/4.3 |
| 3,503,006 | 3/1970 | Hoskins et al. | 252/301.4 R |
| 3,725,811 | 4/1973 | Murphy | 252/301.4 R |
| 4,216,408 | 8/1980 | Verstegen et al. | 252/301.4 R |
| 4,249,108 | 2/1981 | Wolfe | 252/301.4 R |

FOREIGN PATENT DOCUMENTS

| | | |
|---|---|---|
| 997615 | 1/1952 | France . |
| 1347015 | 11/1963 | France . |
| 2205737 | 5/1974 | France . |
| 2436753 | 4/1980 | France . |
| 2442264 | 6/1980 | France . |
| 2039517 | 11/1978 | United Kingdom .......... 252/301.4 R |

OTHER PUBLICATIONS

Jl. of Luminescence, vol. 20, 1979, pp. 99–109, Stevels.
Chem. Abs., vol. 85, 1976/Nov., p. 636, 85: 169268j.
Blasse et al, "Energy Transfer from Trivalent", published in Physics Letters, Jul. 17, 1967, vol. 25A, pp. 29 and 30.

*Primary Examiner*—Hiram H. Bernstein
*Attorney, Agent, or Firm*—Oblon, Fisher, Spivak, McClelland & Maier

[57] ABSTRACT

A mixed aluminum oxide having the following formula:

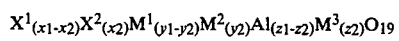

wherein $X^1$ and $X^2$, which can be the same or different, represent a metal selected from the group consisting of lanthanum, praseodymium, neodymium, samarium and gadolinium, provided that $X^1$ and $X^2$ are different when $X^1$ or $X^2$ represents lanthanum or gadolinium; $M^1$ and $M^2$, which can be the same or different, each represent a metal selected from the group consisting of magnesium and divalent transition metals; $M^3$ represents a trivalent transition metal; $x_1$ represents a number from 0.8 to 1; $y_1$ represents a number from 0.7 to 1; $z_1$ represents a number from 10 to 12; $x_2$ represents a number from 0 to $x_1$; $y_2$ represents a number from 0 to $y_1$; and $z_2$ represents a number from 0 to 1; and wherein said mixed aluminum oxide has a single phase crystalline structure of the magnetoplumbite type. A process for producing the mixed oxide is also disclosed, as well as its applications to power lasers emitting in the infrared and to telecommunications by optical fibers.

18 Claims, 2 Drawing Figures

MIXED RARE EARTH METAL, DIVALENT TRANSITION METAL, ALUMINUM OXIDE

This is a continuation of application Ser. No. 281,396, filed July 8, 1981 now abandoned.

BACKGROUND OF THE INVENTION

The present invention relates to mixed aluminium oxides, their production process and their use.

More specifically the present invention relates to mixed aluminium oxides obtained in the form of monocrystals and more particularly used in the field of microlasers for integrated optics or telecommunications by optical fibres, as well as in the field of power lasers emitting in the infrared permitting, for example, the processing of materials, the performance of photochemical reactions and controlled thermonuclear fusion.

At present mixed aluminium oxides are known and in particular mixed aluminates of lanthanum-magnesium, cerium-magnesium, lanthanum-manganese and cerium-manganese of chemical formula $LnMAl_{11}O_{19}$ in which Ln stands for the lanthanum or cerium and M for the magnesium or manganese. These mixed aluminium oxides produced by the Philips company can be doped by luminescent ions such as $Ce^{3+}$, $Tb^{3+}$, $Eu^{2+}$, $Mn^{2+}$ ions.

These doped or undoped mixed oxides obtained only in the form of powders have important luminescent properties (display device, etc.), but have no laser effect. Their production processes and their optical properties (luminescence) are described in a number of articles such as, for example, an article entitled "Cerium and Terbium luminescence in $LaMgAl_{11}O_{19}$", published in the Journal of Luminescence 6, 1973, pp. 425 to 431 and in another article entitled "Red $Mn^{2+}$ luminescence in hexagonal aluminates" published in the Journal of luminescence 20, 1979, pp. 99 to 109.

BRIEF SUMMARY OF THE INVENTION

The present invention relates to mixed aluminium oxides obtained in the form of monocrystals and which in particular have optical properties permitting their use as a laser emitter.

The present invention relates to mixed aluminium oxides, wherein they have the following formula:

$$X^1_{(x1-x2)}X^2_{(x2)}M^1_{(y1-y2)}M^2_{(y2)}Al_{z1z2}M^3_{(z2)}O_{19}$$

in which $X^1$ and $X^2$, which can be the same or different represent a metal in the group of rare earths, provided that $X^1$ and $X^2$ are different when $X^1$ or $X^2$ stand for cerium, lanthanum or gadolinium and provided that when $X^2$ stands for gadolinium, lanthanum, europium, terbium or dysprosium $X^1$ stands for a metal of the group of rare earths other than cerium; $M^1$ and $M^2$, which can be the same or different stand for a metal chosen from the group including magnesium and divalent transition metals; $M^3$ stands for a trivalent transition metal; $x_1$ stands for a number between 0.8 and 1; $y_1$ stands for a number between 0.7 and 1; $z_1$ stands for a number between 10 and 12; $x_2$ represents a number from 0 to $x_1$; $y_2$ represents a number from 0 to $y_1$; and $z_2$ represents a number from 0 to 1; and wherein they have a crystalline structure of the magnetoplumbite type.

It should be noted that these mixed aluminium oxides are obviously single-phase compounds.

These mixed aluminium oxides can have a stoichiometric composition such that $x_1$ is equal to 1, $y_1$ to 1 and $z_1$ to 11, but may also have a slightly different composition with respect to the relative proportion of the lananide ions, i.e. ions of $X^1$ and $X^2$, the divalent ions, i.e. ions of $M^1$ and $M^2$ and the trivalent ions, i.e. the ions of $M^3$ and aluminium, provided that the crystalline structure of these oxides is of the magnetoplumbite type.

Advantageously these mixed aluminium oxides have a composition, other than a stoichiometric composition, such that $x_1$ is equal to 0.95, $y_1$ to 1, $z_1$ to 11 or such that $x_1$ is equal to 1, $y_1$ to 0.9 and $z_1$ to 11.

Advantageously $X^1$ and $X^2$ are chosen from the group including lanthanum, praseodymium, neodymium, samarium, europium, gadolinium, divalent transition metals in the group comprising manganese, iron, nickel and cobalt and the trivalent transition metal is chromium.

Preferably, according to the invention, the mixed aluminium oxide is of formula:

This mixed oxide is particularly suitable as a laser emitter, because it has optical properties comparable to those of the yttrium and aluminium garnet of formula $Y_3Al_5O_{12}$ in which 1% of the yttrium ions are substituted by neodymium ions and known as YAG and the neodymium ultraphosphate ($NdP_5O_{14}$) used at present as the emitter for lasers operating in the infrared.

These mixed oxides are obtained on the basis of a first process, wherein powders of oxides of $X^1$, $X^2$, $M^1$, $M^2$, $M^3$ and aluminium in appropriate proportions are intimately mixed and the mixture obtained is melted.

According to another feature of this first process the molten mixture is treated so as to obtain a monocrystal by solidifying the mixture.

These mixed oxides can also be obtained by a second process, wherein the hydroxides of salts of $X^1$, $X^2$, $M^1$, $M^2$, $M^3$ and aluminium, dissolved in a non-aqueous solvent in appropriate proportions are coprecipitated and the coprecipitate obtained is calcined.

According to another feature of this second process the coprecipitate is melted after the pulverization thereof and the molten coprecipitate is obtained so as to obtain a monocrystal by solidification of the said coprecipitate.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

In exemplified manner we will describe hereinafter the production of the mixed aluminate of neodymium-magnesium of formula $NdMgAl_{11}O_{19}$.

For this purpose the aluminium oxide in powder form, supplied by Industrie des Pierres Scientifiques H. Djevahirdjian, 1870 Monthey, Switzerland, neodymium oxide ($Nd_2O_3$) supplied by Rhone-Progil and magnesium oxide (MgO) of quality R P. (oxide for analysis), supplied by Prolabo and also in powder form are intimately mixed, e.g. in stoichiometric proportions, i.e. in accordance with the chemical reaction:

$$11Al_2O_3 + Nd_2O_3 + 2MgO \rightarrow 2NdMgAl_{11}O_{19}$$

These oxides are in the form of a powder with a grain size distribution between 1 and 10µ and a purity level exceeding 99.9%.

Intimate mixing of these powders can take place either in the solid state in a mortar by pulverization for approximately 30 minutes, or by dispersing the powders in an organic solvent, preferably ether or acetone so as to improve the homogeneity of the mixture. The suspension is then vigorously stirred for approximately 30 minutes. As the organic solvent has no chemical function it is then eliminated by evaporation.

In order to obtain e.g. 30.7 g of mixture 6.730 g of neodymium oxide and 1.600 g of magnesium oxide are added to 22.400 g of alumina, said constituents having the characteristics defined hereinbefore.

The monocrystal of $NdMgAl_{11}O_{19}$ can be obtained after melting this intimate mixture.

For a more complex mixed aluminium oxide containing, for example, besides the constituents referred to hereinbefore lanthanum and chromium, the mixture is formed in the same way by adding in adequate proportions lanthanum oxide ($La_2O_3$) and chromic oxide ($Cr_2O_3$) in powder form.

As oxides of lanthanides ($La_2O_3$, $Nd_2O_3$, . . . ) are very hydroscopic they must be calcined before mixing them with the other constituents, e.g. at a temperature of approximately 1000° C.

Figure 1:
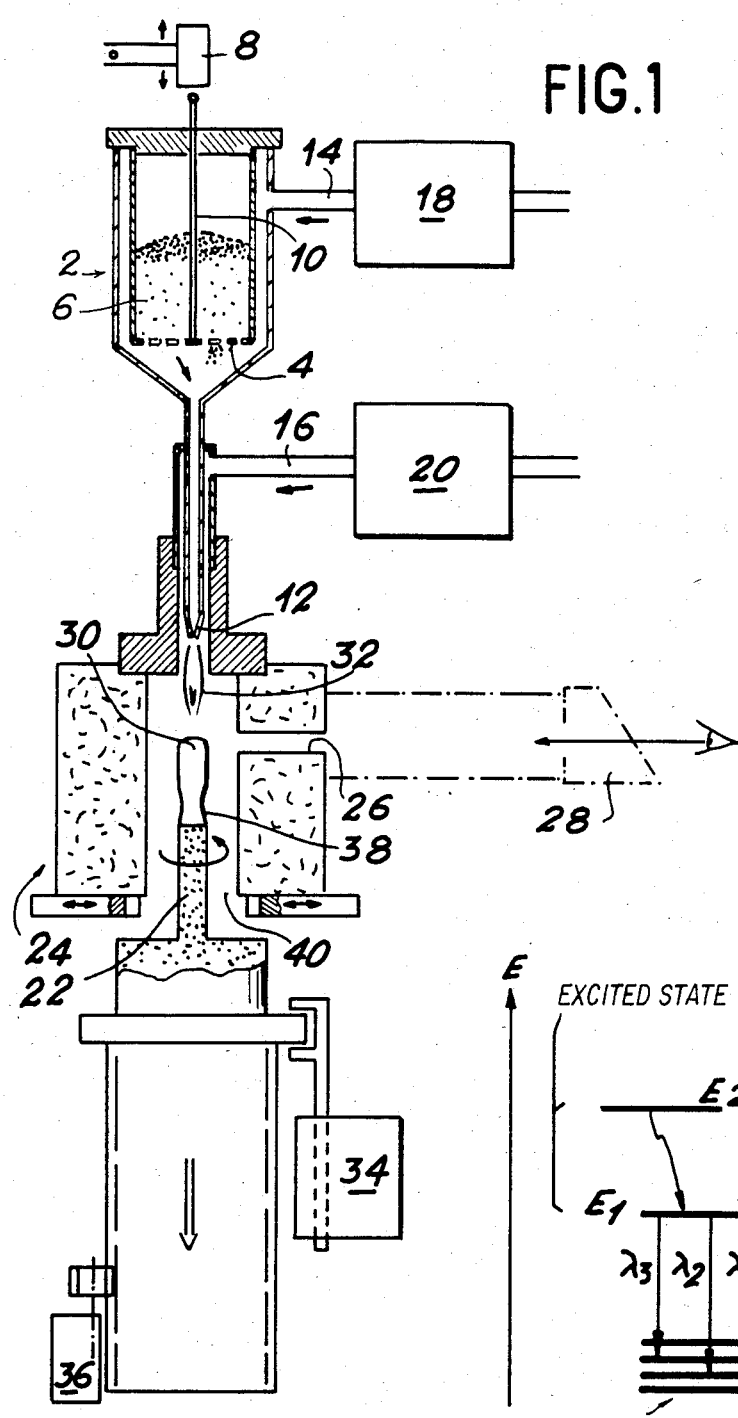
FIG. 1 diagrammatically a device for obtaining a monocrystal from mixed aluminium oxides according to the invention.

The monocrystal can be obtained either by the zone melting or floating zone method, or by direct induction of the high frequency in an automatic crucible, followed by slow cooling from the crucible walls, (method known as the Kyropoulos method) or by drawing from a molten bath (method known as the Czochralski method) or by the Verneuil method. The latter method, which is easy to perform makes it possible to obtain large monocrystals. It will now be described with reference to the apparatus diagrammatically shown in FIG. 1.

This apparatus comprises a powder distributor 2 having in its lower part a screen 4 on which is placed the previously obtained powder mixture 6. This screen 4 has a mesh width which can vary between 125 and 210µ, so as to permit the passage of the powders. Powder distributor 2 also comprises an impact or percussion device, constituted by a hammer 8 and a rod 10 in contact with the bottom of screen 4.

When hammer 8 strikes rod 10, the latter starts to vibrate, thus causing a certain quantity of powder to fall in the direction of a nozzle 12 of an oxyhydrogen blowpipe. The speed of the hammer blows can vary between 10 and 40 blows per minute, which causes 1 to 6 milligrams of powder to drop at each impact.

The oxyhydrogen blowpipe makes it possible to melt the powder mixture 6. The blowpipe is supplied with oxygen by means of a delivery pipe 14 located at the top of the distributor so as to drive the powder 6 towards the blowpipe nozzle 12. Hydrogen is supplied by delivery pipe 16. The oxygen flow rate varies between 4 and 7 liters per minute (l/mm) at a pressure of approximately 10 millibars (mb) and is controlled by a system of manometers and flowmeters diagrammatically indicated at 18. The hydrogen flow rate varies between 12 and 21 l/mn at a pressure of approximately 2 mb and is controlled in the same way by means of a system 20.

The powder mixture 6 melted by means of the blowpipe is then deposited on an alumina support 22 placed within a clay muffle 24, whose inner faces are covered with alumina.

Muffle 24 has a window 26 which can be associated with an optical device 28 making it possible to check the formation of monocrystal 30 and to maintain the crystallization front at a constant level. The crystallization front is maintained in blowpipe flame 32 by means of an automatic device 34 enabling support 22 to be lowered. Support 22 can also be rotated by an automatic device 36.

In order to produce the mixed aluminium oxide monocrystal following the starting up of the blowpipe the high powder flow rate is fixed so as to obtain on support 22 a fritted cone 38 of mixed oxide which has a height of approximately 10 mm. The fall of powder mixture 6 is then stopped and blowpipe flame 32 regulated so as to bring about the melting of the mixed oxide. A molten drop which will give the crystallization nucleus then forms at the apex of cone 38. This drop can spread over a diameter varying between 3 and 10 mm. The growth of the monocrystal is initiated. The powder supply is then regulated (number of hammer blows per minute) so as to maintain the crystallization front at a constant level, i.e. in blowpipe flame 32, as well as a processing speed for monocrystal 30 of approximately 10 to 20 mm/hour.

At the end of the operation the supply of powder 6 is stopped and monocrystal 30 is progressively removed from the blowpipe flame 32. After stopping the blowpipe monocrystal 30 is cooled in muffle 24 making it possible to prevent any sudden temperature variation. A sudden temperature variation could cause cracks in the monocrystal.

Furthermore, to prevent a too rapid cooling of monocrystal 30 the lower part 40 of the muffle is closed. When the monocrystal is completely cooled it is merely necessary to separate it from cone 38 by a single saw stroke.

In this way it is possible to obtain a sample e.g. of $NdMgAl_{11}O_{19}$ having a diameter of approximately 15 mm and a length of 50 mm. Processing of such a sample can last 5 to 8 hours and cooling is controlled by the thermal inertia of muffle 40.

It should be noted that all the mixed oxides according to the invention have a crystalline growth close to that of alumina. It would appear to be no more difficult to produce them in the form of monocrystals than to produce alumina monocrystals.

The monocrystal of $NdMgAl_{11}O_{19}$ as well as the other mixed aluminium oxides according to the invention can be obtained by another production process. This process for the oxide of $NdMgAl_{11}O_{19}$ consists of coprecipitating in amorphous form (i.e. very reactive form) the hydroxides of the various elements Nd, Mg and Al.

Firstly three solutions are formed, which are then mixed in appropriate proportions, e.g. in stoichiometric proportions to obtain the mixed oxide of formula $NdMgAl_{11}O_{19}$.

The first solution is constituted by neodymium oxide ($Nd_2O_3$) which is dissolved in highly concentrated hydrochloric acid enabling the corresponding chloride to be obtained. The second solution is constituted by magnesium chloride ($MgCl_2$) which is dissolved in absolute alcohol. The third solution is constituted by aluminium chloride (AlCl$_3$) also dissolved in absolute alcohol.

When the mixture of the three solutions has been formed the corresponding hydroxides are coprecipitated, preferably by ammonia. Certain hydroxides, such as magnesium hydroxide are soluble in ammonia in aqueous solution, so that coprecipitation is performed in a non-aqueous solvent such as absolute alcohol.

The thus obtained coprecipitate is then calcined at a temperature of approximately 500° C. so as to eliminate the ammonium chloride (NH$_4$Cl) formed during ammonia addition. The thus calcined coprecipitate is then pulverized.

As previously it is possible to obtain the monocrystal NdMgAl$_{11}$O$_{19}$ from this coprecipitate by the Verneuil method or by any of the other methods referred to hereinbefore.

The second process according to the invention has the interest of giving a very homogeneous mixture, but it cannot be used in a general basis for all the mixed oxides according to the invention for various chemical reasons. However, the first process can be used with all the mixed aluminium oxides according to the invention, provided that certain operating modifications in connection with the production of the monocrystal are made, as a function of whether the basic constituents for producing the monocrystal have a greater or lesser reducing or oxidizing action.

These mixed oxides obtained as hereinbefore have a hexagonal structure intermediate between the magnetoplumbite structure of formula BaAl$_{12}$O$_{19}$, the sodium alumina $\beta$ structure and the silver alumina $\beta$ structure, which are well known in the art.

The various mixed oxides obtained in the form of monocrystals according to the aforementioned processes and in particular those containing neodymium have optical properties permitting their use as a laser emitter.

It is known that the laser effect is dependent on certain parameters and in particular the life of the excited state of the ions (energy level above the fundamental level). If the life of the excited state is sufficient (several dozen microseconds) population inversion can take place (the number of ions in the excited state exceeds the number of ions in the fundamental state).

Research has shown that the presence of neodymium, associated with lanthanum or gadolinium in the mixed oxides according to the invention makes it possible to obtain sufficiently long lives to bring about this population inversion, gadolinium and lanthanum serving the same function. In mixed oxides the excited state corresponds to the energy level $^4F_{3/2}$ of the Nd$^{3+}$ ion.

The life of the excited state $^4F_{3/2}$ as a function of the quantity of Nd$^{3+}$ ions per cubic centimeter of monocrystal will now be shown for mixed oxides of formula Nd$_{(1-x)}$La$_{(x)}$MgAl$_{11}$O$_{19}$ with x between 0 and 1. The final compound of formula Y$_3$Al$_5$O$_{12}$ with 1% of neodymium, called YAG is given for comparison purposes (see attached table).

This table shows that the more lanthanum contained by the mixed compound the longer the life of the excited state. Moreover, for a concentration of Nd$^{3+}$ ions between 0.03 and 0.34$\times$10$^{21}$/cm$^3$ the life of the excited state of a mixed oxide according to the invention is longer than that of the excited state for the reference compound used at present as the emitter for lasers.

It should be noted that a mixed oxide which does not contain lenthanum, i.e. of formula LaMgAl$_{11}$O$_{19}$ has no laser effect. The latter is due to the presence of neodymium in the mixed oxides according to the invention. The other mixed oxides according to the invention which contain praseodymium, samarium or europium as the lanthanide and which may or may not be associated with lanthanum or gadolinium have interesting luminescent properties.

The optical properties (luminescence or laser effect) are characteristic of the lanthanides referred to hereinbefore, so that the magnesium present in the mixed oxide in question may wholly or partly be replaced by manganese, iron, nickel and cobalt in divalent form, said elements serving the same function.

It is also known that the laser effect is dependent on the oscillator strength of the transitions in the luminescent ions. This oscillator strength must be as high as possible. The mixed oxides according to the invention have oscillator strengths, when light is propagated along the C axis of the crystal, which are close to those e.g. of neodymium ultraphosphate.

The fluorescence intensity increases with the concentration of neodymium ions, but too high a quantity of Nd$^{3+}$ ions aids interactions between luminescent ions which are prejudicial to fluorescence. As the presence of lanthanum makes it possible to increase the fluorescence yield by a dilution effect the mixed oxide of formula Nd$_{0.1}$La$_{0.9}$MgAl$_{11}$O$_{19}$ seems to be a good compromise with regards to the quantity of Nd$^{3+}$ ions.

A good fluorescence yield can be obtained by using basic constituents having a high purity (above 99.9%) for the production of the mixed oxides according to the invention having a laser effect. The presence of impurities in the monocrystal would lead to fluorescence losses, because neodymium ions in the excited state could be deactivated to the fundamental state in a non-radiative process.

Figure 2:
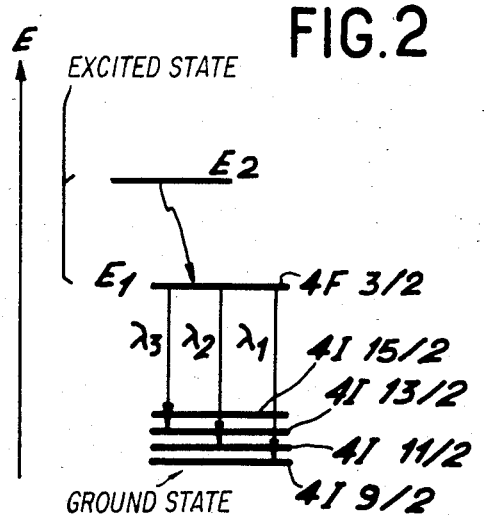
FIG. 2 diagrammatically the fluorescence emission diagram of the mixed oxide $Nd_{0.1}La_{0.9}MgAl_{11}O_{19}$.

Research has shown that mixed oxides containing neodymium have three types of emission, shown in FIG. 2, between the excited state $^4F_{3/2}$ having an energy E$_1$ and the state $^4I$ having four sublevels of increasing energy E $^4I_{9/2}$, $^4I_{11/2}$, $^4I_{13/2}$, $^4I_{15/2}$.

The emission between the excited level E$_1$ and level $^4I_{9/2}$ has a wavelength $\lambda_1$ close to 0.89$\mu$, the emission between the excited level E$_1$ and level $^4I_{11/2}$ has a wavelength $\lambda_2$ close to 1.06$\mu$ and emission between the excited level E$_1$ and level $^4I_{13/2}$ has a wavelength $\lambda_3$ close to 1.32$\mu$.

Emission at the wavelength 1.06 makes it possible to use these mixed oxides in lasers working in the infrared.

Emissions at wavelengths of 1.06 and 1.32$\mu$ should make it possible to use these mixed oxides in the field of telecommunications by optical fibres. Thus, optical fibres, e.g. of silica, which to a greater or lesser extent absorb the wavelengths to be transmitted, have a low attenuation at these wavelengths, so that a maximum of information can be transmitted.

To bring about the population of the excited state $^4F_{3/2}$ of energy E$_1$ the atoms are excited up to an energy level E$_2$, such that E$_2$ exceeds E$_1$. The population of the energy state E$_2$ is obtained by light absorption. The energy level E$_2$ is very unstable, so that the Nd$^{3+}$ ions are spontaneously deenergized to the energy state E$_1$, state $^4F_{3/2}$. This method of populating the excited state $^4F_{3/2}$ is known as optical pumping. As the neodymium absorption peaks are very narrow in certain cases the light absorption of these mixed oxides can be aided by substituting e.g. 1% of the aluminium ions by transition metal ions and preferably by chromium. Thus, in the visible range the latter has two much wider absorption bands (400 to 500 and 600 to 700 nanometers).

The energy due to light absorption by chromium can be transmitted to the $Nd^{3+}$ ions, permitting the population of the energy level $E_1$.

The physical properties of the mixed oxides according to the invention, like the mechanical and thermal properties are close to the physical properties of alumina.

Research on the magnetic properties carried out on the oxide $NdMgAl_{11}O_{10}$ have shown that this oxide has an important anisotropy of its magnetic susceptibility mainly at low temperatures.

Mixed oxides containing neodymium associated with gadolinium or lanthanum have optical properties making it possible to use them as an emitter for lasers working in the infrared range and which can for example be used in the processing of materials or telecommunications by optical fibres.

TABLE

| Mixed oxides | Number of $Nd^{3+}$ ions/cm$^3$ ($\times 10^{21}$) | Life of excited state $^4F_{3/2}$ in microseconds |
|---|---|---|
| $NdMgAl_{11}O_{19}$ | 3.36 | 27 |
| $Nd_{0.33}La_{0.66}MgAl_{11}O_{19}$ | 1.12 | 52 |
| $Nd_{0.1}La_{0.9}MgAl_{11}O_{19}$ | 0.34 | 260 |
| $Nd_{0.05}La_{0.95}MgAl_{11}O_{19}$ | 0.17 | 360 |
| $Nd_{0.01}La_{0.99}MgAl_{11}O_{19}$ | 0.03 | 360 |
| $Y_3Al_5O_{12}$ with 1% $Nd^{3+}$ | 0.14 | 200 to 240 |

What is claimed is:

1. A mixed aluminum oxide having the following formula:

$$X^1_{(x1-x2)}X^2_{(x2)}M^1_{(y1-y2)}M^2_{(y2)}Al_{(z1-z2)}M^3_{(z2)}O_{19}$$

wherein $X^1$ represents a metal selected from the group consisting of lanthanum, praseodymium, neodymium, samarium and gadolinium, and $X^2$ represents a metal selected from the group consisting of praseodymium, neodymium, samarium, $X_1$ and $X_2$ being the same or different; $M^1$ and $M^2$, which can be the same or different, represent a metal selected from the group consisting of magnesium and divalent transition metals; $M^3$ represents a trivalent transition metal; $x_1$ represents a number from 0.8 to 1; $y_1$ represents a number from 0.7 to 1; $z_1$ represents a number from 10 to 12; $x_2$ represents a number from 0 to $x_1$, $x_2$ being different from 0 when $X_1$ represents lanthanum or gadolinium; $y_2$ represents a number from 0 to $y_1$; and $z_2$ represents a number from 0 to 1; and wherein said mixed aluminum oxide has a single phase crystalline structure of the magnetoplumbite type.

2. A mixed oxide according to claim 1, wherein $x_1$ is equal to 1, $y_1$ to 1 and $z_1$ to 11.

3. A mixed oxide according to claim 1, wherein $x_1$ is equal to 0.95, $y_1$ to 1 and $z_1$ to 11.

4. A mixed oxide according to claim 1, wherein $x_1$ is equal to 1, $y_1$ to 0.9 and $z_1$ to 11.

5. A mixed oxide according to claim 1, wherein the transition metals $M^1$ and $M^2$ are selected from the group consisting of magnanese, iron, nickel and cobalt.

6. A mixed oxide according to claim 1, wherein $M^3$ is chromium.

7. A mixed oxide according to claim 1, wherein $X^1$ represents lanthanum or gadolinium, $X^2$ neodynium and $M^1$ magnesium.

8. A mixed oxide according to claim 7, wherein $x_2$ is equal to 0.1.

9. A mixed oxide of the formula:

$$La_{0.9}Nd_{0.1}MgAl_{11}O_{19}$$

having a single phase crystalline structure of the magnetoplumbite type.

10. A mixed aluminum oxide of the formula:

$$Nd_{(1-x)}La_{(x)}MgAl_{11}O_{19}$$

wherein x stands for a number from 0 to 0.99 and having a single phase crystalline structure of the magnetoplumbite type.

11. A mixed aluminum oxide having the following formula:

$$X^1_{(x1-x2)}Nd_{(x2)}M^1_{(y1-y2)}M^2_{(y2)}Al_{(z1-z2)}M^3_{(z2)}O_{19}$$

wherein $X^1$ represents lanthanum or gadolinium; $M^1$ and $M^2$, which can be the same or different, each represent a metal selected from the group consisting of magnesium and divalent transition metals; $M^3$ represents a trivalent transition metal; $x_1$ represents a number from 0.8 to 1; $y_1$ represents a number from 0.7 to 1; $z_1$ represents a number from 10 to 12; $x_2$ represents a number within the range of $0 < x_2 \leq x_1$; $y_2$ represents a number from 0 to $y_1$; and $z_2$ represents a number from 0 to 1; and wherein said mixed aluminum oxide has a single phase crystalline structure of the magnetoplumbite type.

12. The mixed oxide according to claim 11, wherein $x_1$ is equal to 1, $y_1$ is equal to 1 and $z_1$ is equal to 11.

13. The mixed oxide according to claim 11, wherein $x_1$ is equal to 0.95, $y_1$ is equal to 1 and $z_1$ is equal to 11.

14. The mixed oxide according to claim 11, wherein $x_1$ is equal to 1, $y_1$ is equal to 0.9 and $z_1$ is equal to 11.

15. The mixed oxide according to claim 11, wherein the transition metals $M^1$ and $M^2$ are selected from the group consisting of manganese, iron, nickel and cobalt.

16. The mixed oxide according to claim 11, wherein $M^3$ is chromium.

17. The mixed oxide according to claim 11, wherein $M^1$ is magnesium.

18. The mixed oxide according to claim 17, wherein $x_2$ is equal to 0.1.

* * * * *